(12) United States Patent
Alers

(10) Patent No.: US 6,271,596 B1
(45) Date of Patent: Aug. 7, 2001

(54) DAMASCENE CAPACITORS FOR INTEGRATED CIRCUITS

(75) Inventor: Glenn B. Alers, Santa Cruz, CA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/292,422

(22) Filed: Apr. 15, 1999

Related U.S. Application Data

(60) Provisional application No. 60/115,520, filed on Jan. 12, 1999.

(51) Int. Cl.$^7$ .................................................. H01L 23/48
(52) U.S. Cl. .......................... 257/774; 257/770; 257/764; 257/763
(58) Field of Search ..................... 257/774, 770, 257/764, 763, 301, 306, 309; 438/629, 637, 639, 640, 667, 668, 672, 675, 700, 701, 713, 978

(56) References Cited

U.S. PATENT DOCUMENTS

| | | | |
|---|---|---|---|
| 4,912,540 | * 3/1990 | Sander et al. | 257/774 |
| 5,244,837 | 9/1993 | Dennison | 437/195 |
| 5,576,240 | 11/1996 | Radosevich et al. | 437/60 |
| 5,654,581 | 8/1997 | Radosevich et al. | 257/534 |
| 5,677,563 | 10/1997 | Cronin et al. | 257/506 |
| 5,753,948 | 5/1998 | Nguyen | 257/307 |
| 5,801,094 | 9/1998 | Yew et al. | 438/624 |
| 5,972,789 | * 10/1999 | Jeng et al. | 438/637 |
| 6,080,659 | * 6/2000 | Chen et al. | 438/633 |

FOREIGN PATENT DOCUMENTS 11-26461 * 1/1999 (JP) ..................................... 257/774

OTHER PUBLICATIONS

"Stacked High–ε Gate Dielectric For Gigascale Integrateion Of Metal–Oxide–Semiconductor Techniques," P.K. Roy et al., *Applied Physics Letters*, vol. 72, No. 22, Jun. 1998, pp. 2835–2837.

* cited by examiner

*Primary Examiner*—Jhihan B Clark
(74) *Attorney, Agent, or Firm*—Anthony Grillo; William S. Francos

(57) ABSTRACT

The present invention relates to a conductive plug capacitor and method of making for use in multi-level integrated circuit structures. In one embodiment, a tungsten plug is formed in a window in a dielectric layer and thereafter a cavity is formed in the plug. This cavity in the plug may serve as the lower electrode for the capacitor, with a layer of dielectric deposited in the cavity and a top metal electrode deposited on the dielectric layer. An alternative embodiment makes use of not only the inner cavity surfaces of the cavity in the tungsten plug, but also the outer sidewalls of the tungsten plug. To this end, after formation of the tungsten plug heading the cavity formed therein, a partial etchback of the dielectric layer in which the tungsten plug is formed is effective. The capacitor dielectric is then deposited on the sidewalls, the top surface and the interior of the cavity of the tungsten plug thereby increasing the area and thereby the over capacitance.

20 Claims, 3 Drawing Sheets

DAMASCENE CAPACITORS FOR INTEGRATED CIRCUITS

CROSS-REFERENCE TO RELATED APPLICATION

This application claims priority of Provisional Application Serial No. 60/115,520 which was filed on Jan. 12, 1999.

FIELD OF THE INVENTION

The present invention relates to a capacitor structure and method of making the capacitor for use in integrated circuits and a method for forming the structure.

BACKGROUND OF THE INVENTION

Dynamic random access memory (DRAM) relates to electronic devices consisting of cells which can retain information only for a limited time before they must be read and refreshed at periodic intervals. A typical DRAM cell consists of at least one transistor and a storage capacitor. In general, the integrated circuit used for DRAMs consists of metal oxide semiconductor (MOS) and particularly complementary MOS structures (CMOS) as the transistor component. Recently, the capacity of such DRAM structures has evolved from one megabit to on the order of one gigabit. This increase in memory has required the evolution of gate feature sizes on the order of 1.25 microns down to on the order of 0.25 microns or smaller. As the DRAM capacity requirements are increased, the requirements placed on the capacitors are increased as well. Not only is there a requirement for increased capacitance, there is also a requirement to increased capacitance density. Accordingly, development efforts have been focused on materials and structures to meet this need. To minimize interconnection resistance and to maximize the use of valuable chip area, advanced VLSI and ULSI logic integrated semiconductor circuits use multi-level wiring line structures for interconnecting regions within the devices and for interconnecting one or more devices within the integrated circuit. Multi-level metallization provides greater flexibility in circuit design, a reduction in die size and, thereby, a reduction in chip cost. In fabricating such structures, the conventional approach is to form lower level wiring lines (or interconnect structures) and then form one or more upper level wiring lines interconnected with the first level wiring lines. A first level interconnect structure may be in contact with the doped region within the substrate of an integrated circuit device (for example the source or drain of a typical MOSFET). One or more interconnections are typically formed between the first level interconnect and other portions of the integrated circuit device or to structures external to the integrated circuit device. This is accomplished through the second and subsequent levels of wiring lines. An example of the multi-layer interconnect structure used in conventional VLSI and ULSI structures can be seen in FIG. 1. Conductive vias, shown generally at 101 are used to make the connection from one level to another. As is shown in FIG. 1, metal layer M-1 at the first level is connected to the source (S) formed in the substrate layer of the integrated circuit. This metal layer M-1 is used to make electrical connections at level one as well as at higher levels using the via structure as shown.

An embedded DRAM structure adds integrated capacitors to the logic transistors to add high density memory cells to the circuit. These integrated capacitors can be connected to the source metallization of the MOS device to form the memory cell. Conventional DRAM capacitors often have a layer of polysilicon as the bottom electrode; a layer of silicon dioxide or silicon nitride as the insulator; and a top metal layer forming the top electrode. Such a structure is generally not compatible with embedded technology because of the added complexity of the poly-Si capacitors and the high temperatures required to grow the silicon oxide/nitride layer. For example, the aluminum metal layers used as interconnects in the multi-layer structure can be adversely affected by the relatively high temperatures used in the deposition of polysilicon. Furthermore, the use of polysilicon as an electrode can have deleterious affects on the electrical characteristics of the device. It is known to use tantalum pentoxide as the dielectric of the capacitor because of its a higher dielectric constant compared to silicon dioxide or silicon nitride. During the chemical vapor deposition used to form the tantalum pentoxide, a layer of silicon dioxide is formed generally between the polysilicon layer and the tantalum pentoxide layer. This layer of silicon dioxide is not desired, as it tends to adversely impact the capacitance of the capacitor. Accordingly, there is a need for a capacitor structure in DRAM's which avoids the use of polysilicon electrodes.

FIG. 2 shows the capacitor structure disclosed in U.S. Pat. No. 5,576,240 to Radosevich et al, the disclosure of which is specifically incorporated by reference herein. In the structure shown in FIG. 2, a capacitor has a lower plate 201 with a layer of dielectric 202 and a top plate 203 in the trench structure as shown. While the structure shown in FIG. 2 has certain advantages compared to planar-type storage capacitors, applicants have recognized that this structure may not lend itself well to multi-layer reduced feature size ULSI fabrication techniques. In particular, planarization plays an important role in the fabrication of multi-layer integrated circuits. To this end, during the process of circuit fabrication, various growth and deposition techniques used to form insulating and conducting layers can result in an increasingly non-planar structure which presents two major problems. The first problem is one of maintaining step coverage without breaks in the continuity of fine line structures. The second problem is a reduction in the optical resolution and therefore reduction in the ability to image fine-line patterns over the wafer structure. Accordingly, polishing techniques are used to maintain planarity at each level in a multi-level structure. One technique which has become widely embraced for planarization is chemical mechanical polishing (CMP). Such a polishing step would be utilized after the fabrication of the capacitor shown at FIG. 2 in order to maintain a planar topology. After the fabrication of the capacitor 204, a CMP or other planarization step would be employed and subsequent deposition of metal and dielectric layers for the next level of the multi-level structure would be carried out. However, the layers shown as 201, 202 and 203 which form the layers of the capacitor are relatively thin. Applicants recognize that chemical mechanical polishing could result in the shorting of layers 201 and 203. Thus, applicants have determined that chemical mechanical polishing technique which is clearly desired in the fabrication of multi-layer integrated circuits may not be compatible with a capacitor structure as shown in FIG. 2.

What is needed, therefore, is a capacitor structure which improves the capacitance density while being readily adaptable to standard/low temperature processing and planarization techniques.

SUMMARY OF THE INVENTION

The present invention relates to a conductive plug capacitor and method of manufacture thereof for use in multi-level integrated circuit structures. In an illustrative embodiment, a conductive plug is formed in a window in a dielectric layer and thereafter a cavity is formed in the plug. This cavity may serve as the lower plate of the capacitor, with a layer of dielectric deposited in the cavity and a top conductive layer (e.g., metal) disposed thereon serving as the upper plate. During the fabrication of the capacitor, chemical mechanical polishing is done after the formation of the conductive plug. Thereafter, the cavity is etched in the plug with the deposition of the dielectric and top plate following. The CMP process results in a substantially planarized dielectric and tungsten plug, thereby making the capacitor fabrication sequence compatible with multi-layer fabrication techniques.

DETAILED DESCRIPTION OF THE INVENTION

Figure 1:
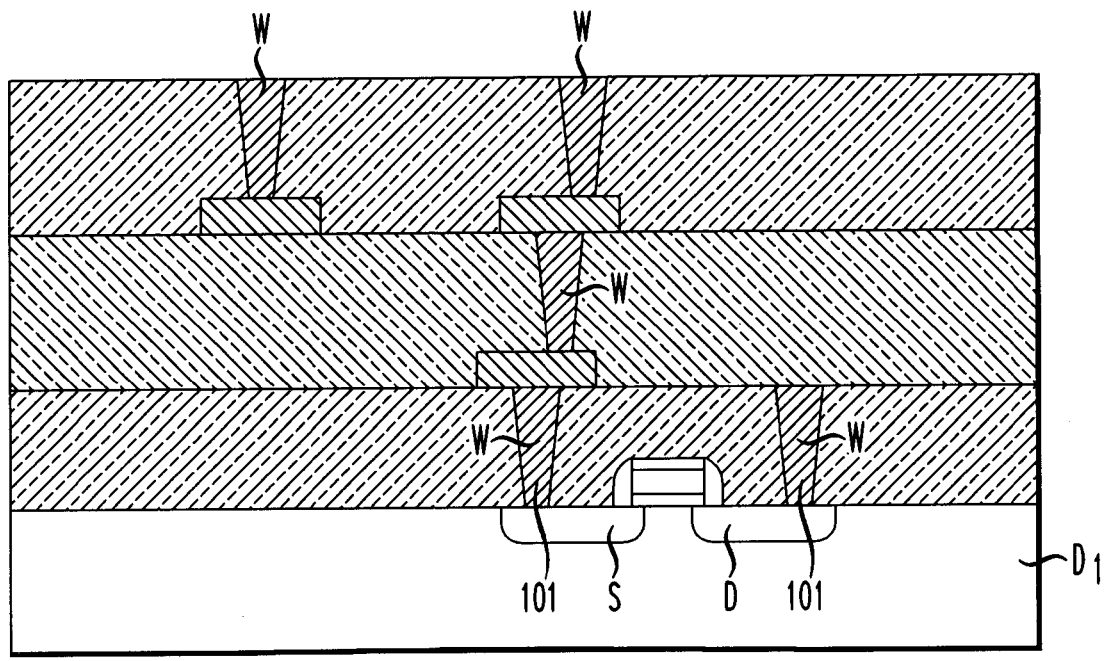
FIG. 1 is a cross-sectional view of a conventional multi-layer IC structure.
Figure 2:
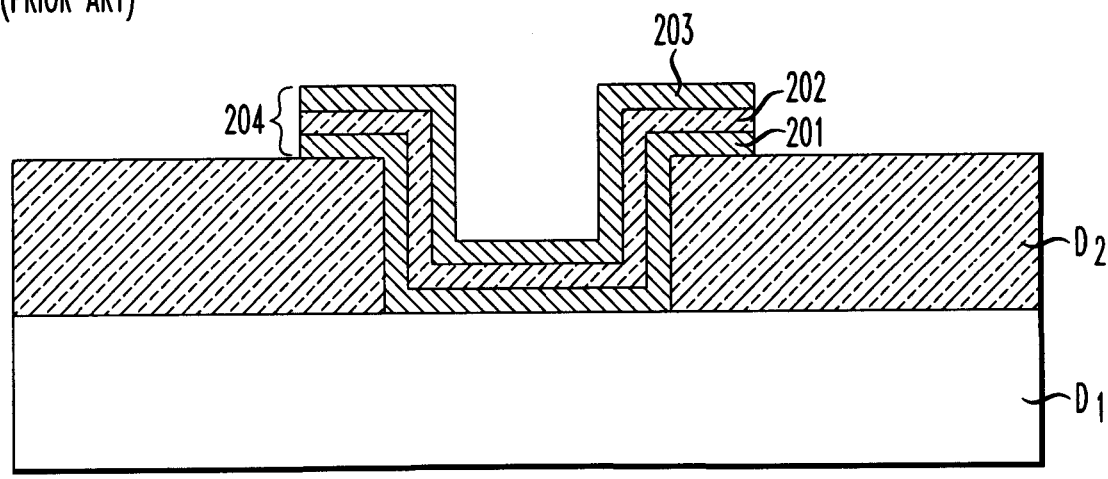
FIG. 2 is a cross-sectional view of a prior art capacitor structure.
Figure 3:
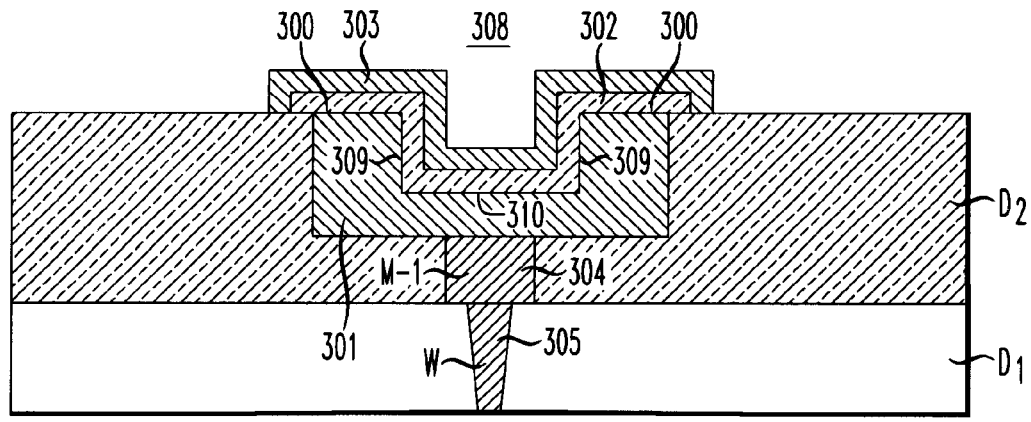
FIG. 3 is a cross-sectional view of an exemplary embodiment of the present invention.

In FIG. 3 a first illustrative embodiment the conductive plug 301, preferably tungsten or other metal material, has a cavity 308 therein. The plug is in electrical contact with the metal-1 layer 304 which in turn is connected to the conductive via 305 (preferably tungsten). As discussed above, this conductive via is ultimately in contact with the source or drain of a field effect transistor, not shown in FIG. 3. The capacitor of the embodiment shown in FIG. 3 has a lower plate formed by the sidewalls of the cavity 309, the lower surface of the cavity 310, and the top surface of the plug 300. Alternatively, this electrode can be a single or multi-layer conductive stack disposed on the surface of the cavity. The dielectric 302 of the capacitor has the upper plate of the capacitor 303 disposed thereon. As can be appreciated from the cross-sectional view of FIG. 3, both the capacitance density as well as the overall capacitance is increased by virtue of the structure of this embodiment. The material chosen as the dielectric material for the capacitor preferably is tantalum pentoxide shown at 302. This material is a high dielectric constant material, and, thereby enables a higher capacitance density when compared to previously employed materials, such as silicon dioxide. Alternatively, titanium oxide, silicon oxide, barium strontium titanate, or lead zirconium titanate could be used as the dielectric. Furthermore, the structure shown in FIG. 3 enables a larger electrode area through the use of the cavity surface 309, 310 and the top surface 300. Additionally, the capacitor structure shown in FIG. 3 comprises a tungsten plug, shown generally at 301, in an opening formed in the dielectric $D_2$ having a diameter on the order of 1.0 micron. The cavity in the tungsten plug shown generally at 308, is formed in the tungsten plug had a diameter on the order of 0.5 microns with an etch depth in the range of approximately 0.2 microns to 0.5 microns. Clearly, such a structure will afford more area in which to form the capacitor, when compared the plate area of typical capacitors having feature sizes on the order of 0.25 microns.

Figure 4:
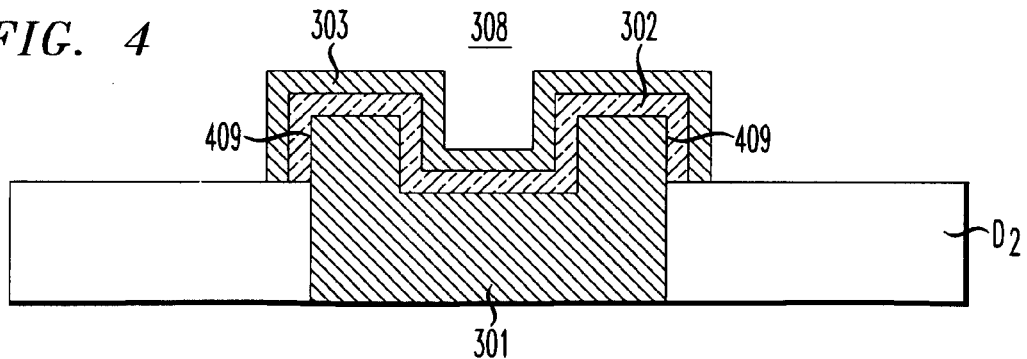
FIG. 4 is a cross-sectional view of another embodiment of the present invention.

An alternative embodiment is shown in FIG. 4, and has the advantage of increasing even more the available surface area of the plates of the capacitor. In the embodiment shown in FIG. 4, the dielectric layer $D_2$ is partially etched back to reveal the outer sidewalls of the tungsten plug 409. With the exception of the etchback of the second dielectric layer $D_2$, and the formation of the layers 302 and 303 as shown in FIG. 4, the basic processing steps used to form the embodiments in FIGS. 3 and 4 are the same. Accordingly, in the interest of brevity the following discussion on the fabrication of the embodiments of FIGS. 3 and 4 are combined.

Figure 5:
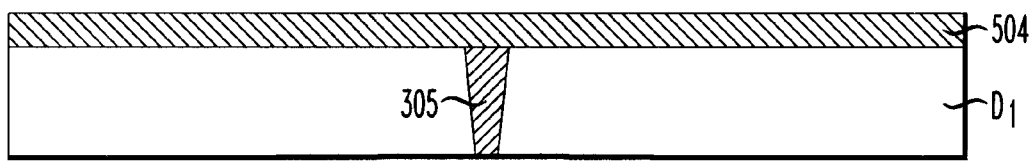
FIGS. 5–10 are cross-sectional views of a process sequence used to fabricate the invention of the present disclosure.
Figure 6:
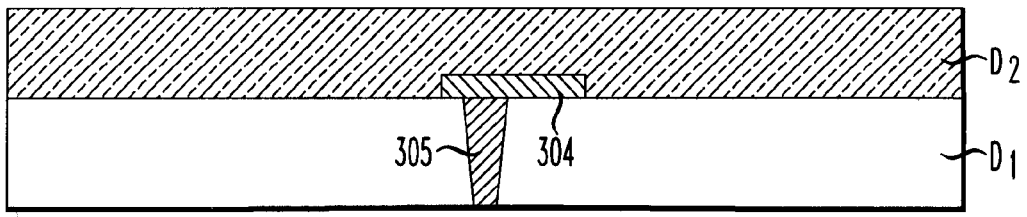
Figure 7:
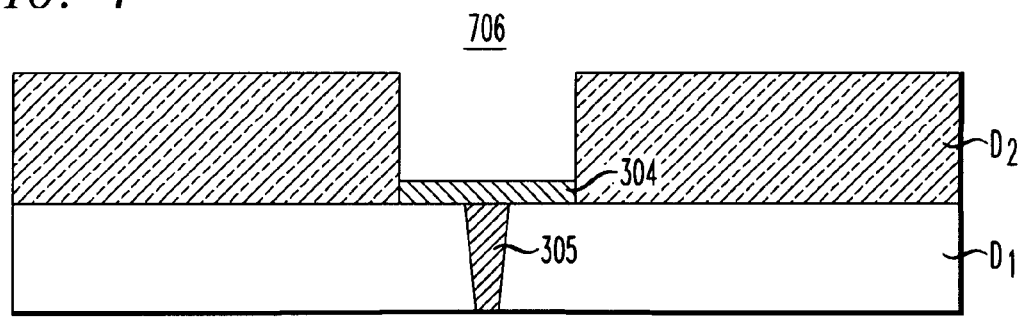
Figure 8:
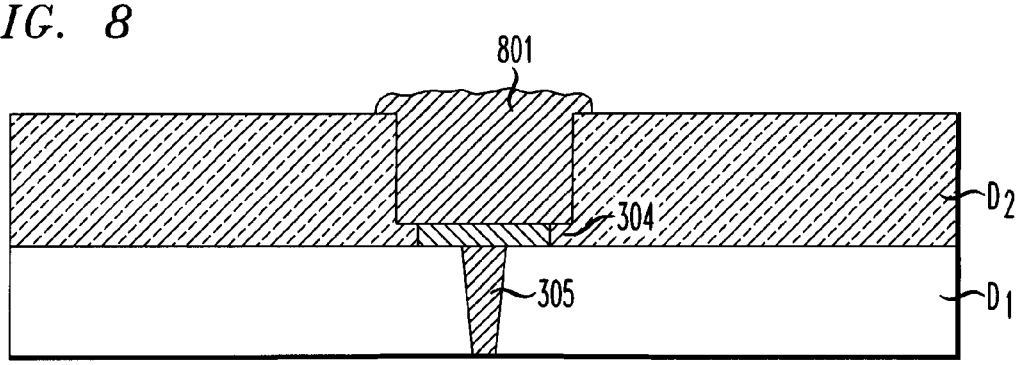

The fabrication steps are discussed presently. As shown in FIG. 5, the layer of aluminum 504 is disposed on the dielectric layer $D_1$, which as been planarized by chemical mechanical polishing to realize the planarization advantages as discussed above. The conductive via 305 is deposited by standard technique. The metal layer 504 is thereafter patterned and etched on top of the dielectric layer $D_1$ to form the interconnect 304 to the transistors at a lower level (not shown). While aluminum is the exemplary interconnect, it is clear that other conductive interconnect materials (e.g., metals) and metal stacks can be used in this capacity. Thereafter as shown in FIG. 6, a second dielectric layer $D_2$ is deposited over the metal interconnect 304 and is formed preferably by plasma-enhanced chemical vapor deposition (PECVD). This layer $D_2$ is preferably $SiO_2$. Other materials as well as techniques for the fabrication of this layer within the purview of one of ordinary skill in the art can be implemented. Following the deposition of the layer of dielectric $D_2$, a window 706 (shown in FIG. 7) is opened by conventional patterning such as by photoresist, masking and subsequent etching. The opening of the window 706 in the dielectric $D_2$ has the diameter on the order of 1 Micron. Prior to the chemical vapor deposition used in the formation of the tungsten plug and conductive vias, it is conventional to provide a seed layer of TiN (not shown) on the sidewalls and lower surfaces of the windows in which the vias 305 and the conductive plugs 301 are formed. As shown in FIG. 8, the window 706 is thereafter back-filled by standard technique with a layer of conductive material 801, such as tungsten or copper.

After the formation of the tungsten plug 801, a planarization step is carried out. This step is preferably by chemical mechanical polishing (CMP) and results in the top surface of the plug's being substantially coplanar with the top surface of the dielectric $D_2$. As can be appreciated from a review of FIGS. 8 and 9, the chemical mechanical polishing is carried out after the deposition of the dielectric $D_1$ (however, before the formation of the metal-1 304), and then again after the deposition of the dielectric layer $D_2$ and formation of the tungsten plug 801. As discussed above, this CMP step is important to maintaining planarity in integrated circuits and their fabrication, and is readily compatible with the process of the present invention. That is, the formation of multi-layer structures creates a significant amount of relief in the topography of the dielectric layer which is formed in subsequent layers. Even though this relief can be reduced, such relief is "additive" and adversely affects subsequent processing. As described above, subsequent photolithographic processing which relies upon optical patterning, as well as metal alignment can be adversely affected by an unacceptable amount of planarity. In contrast, the processing step in the process sequence as described in the present invention results in a planarized dielectric surface, as well as a planarized tungsten plug 901, thereby facilitating the subsequent processing by virtue of the planarity achieved.

Figure 9:
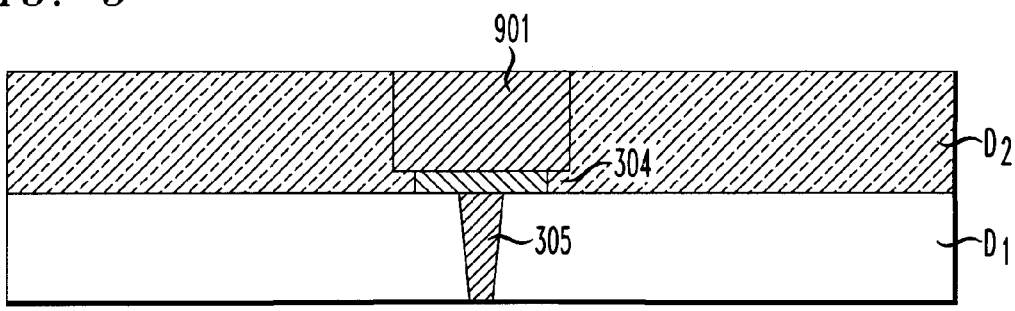

After the planarization step the resultant structure shown in FIG. 9 is subject to a reactive ion etch (RIE). A patterned resist layer(not shown) is formed above the plug 901 and the dielectric D$_2$. The resist is patterned to expose a portion of the plug for this etching step. This results in the cavity shown at 308 shown in FIG. 10, having an opening with a diameter on the order of 0.5 μm and a depth in the range of approximately 0.2 μm to 0.5 μm. The depth is controlled by the RIE step, while the area is controlled by the opening in the resist; thereby other dimensions can be effected. The surfaces of the cavity 308 and surface 300 form the lower plate of the capacitor. Thereafter, a layer of high dielectric constant (ε$_r$) material 302 is deposited by conventional technique. Preferably, this material is tantalum pentoxide deposited by chemical vapor deposition. Other materials can be used as the dielectric such as silicon oxide, titanium oxide or barium strontium titanate. Finally, a top capacitor plate of conductive material such as titanium nitride, tantalum nitride or tungsten nitride is deposited by physical vapor deposition as is shown at 303.

Figure 10:
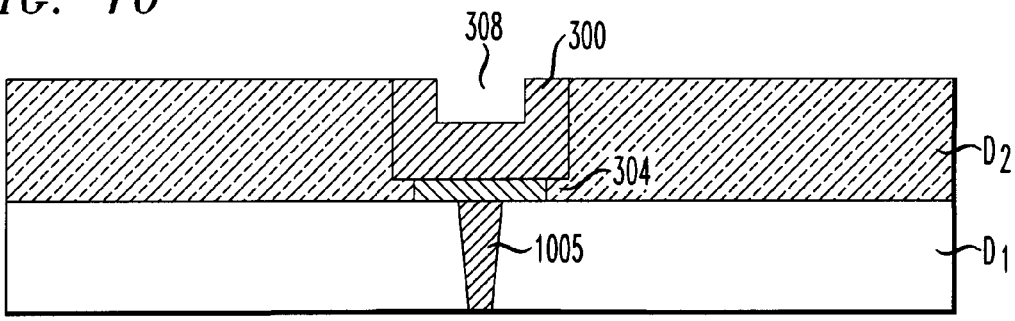

Another illustrative embodiment, shown in FIG. 4, is fabricated essentially the same way as the embodiment shown in FIG. 3, however with the following modifications. After the structure as shown in FIG. 10 is fabricated, a standard etchback of the dielectric layer D$_2$ is conducted. This is by conventional patterning such as by photoresist, masking and etching. The resultant structure is a partially exposed plug. Thereafter, the deposition of the dielectric material 302 and the upper electrode 403 is carried out by the same technique used to form the capacitance of FIG. 3. As discussed briefly herein, this structure increases the area available on which to form a capacitor, and the resultant structure is one of increased capacitance.

Accordingly, the present invention results in improved capacitance density when compared to prior structures. The ability to use the conductive plug as the lower electrode (or plate) instead of polysilicon results in improved capacitance density as the undesired formation of SiO$_2$ is avoided. In addition, the area available in which to fabricate a capacitor is increased by virtue of the tungsten plug having the etched hole therein. Thus, as is desired in the fabrication of DRAM integrated circuits, both the capacitance density and the total capacitance of the memory cell capacitor is increased by virtue of the structure of the present disclosure. Finally, as can be appreciated from a review of the present disclosure, the fabrication techniques of the present invention are compatible with many ULSI structures, materials and processes. In addition to CMP, the dielectric formation used in the fabrication of the capacitor is also compatible with standard VLSI and ULSI structures. The formation of the capacitors shown in embodiments in FIGS. 3 and 4 uses tantalum pentoxide, for example, as the high dielectric constant material. The use of a metal-compatible dielectric such as tantalum pentoxide is of particular interest because the deposition technique is a low temperature deposition, on the order of approximately 500° C. or less. This deposition, as well as the relatively low temperature deposition technique used in the formation of the tungsten plug has clear advantages in its compatibility with embedded technologies.

The invention having been described in detail, it is clear that while the preferred process step and process step sequence and materials have been disclosed, alternative processes, process sequence and materials within the purview of one of ordinary skill in the art can be employed. To the extent that these alternative processes, process sequences and materials result in the improved capacitor structure of the present disclosure and its method of fabrication, such are deemed within the scope of the present invention.

What is claimed:

1. An integrated circuit, comprising:
    a conductive plug having a top surface and a cavity, said cavity having a lower surface and side surfaces;
    wherein a plug is disposed in a dielectric layer having an upper surface and said plug has a top surface substantially coplanar with said upper surface of said dielectric layer;
    a layer of dielectric material disposed on said lower surface, said side surfaces and at least a portion of said top surface; and
    a conductive layer disposed on said dielectric layer.

2. An integrated circuit as recited in claim 1, wherein said layer of dielectric material is selected from the group consisting of tantalum pentoxide, silicon oxide, titanium oxide and barium strontium titinate.

3. An integrated circuit as recited in claim 1, wherein said plug is tungsten.

4. An integrated circuit as recited in claim 1, wherein said layer of dielectric material is selected from the group consisting of tantalum oxide, silicon oxide, titanium oxide and barium strontium titinate.

5. An integrated circuit as recited in claim 1, wherein said plug is tungsten.

6. An integrated circuit as recited in claim 1, wherein said plug is partially disposed in a dielectric layer.

7. An integrated circuit, comprising:
    a conductive plug having a top surface, and a cavity, said cavity having side surfaces and said plug being disposed in a dielectric layer of the integrated circuit;
    a layer of dielectric material disposed on said side surfaces of said cavity and at least a portion of said top surface; and
    a conductive layer disposed on said dielectric layer;
    wherein said conductive layer is selected from the group consisting of titanium nitride, tantalum nitride, tungsten nitride.

8. An integrated circuit as recited in claim 7, wherein said cavity has a lower surface and said layer of dielectric material and said conductive layer are further disposed on said lower surface.

9. An integrated circuit as recited in claim 7, wherein said layer of dielectric material is selected from the group consisting of tantalum oxide, silicon oxide, titanium oxide and barium strontium titinate.

10. An integrated circuit as recited in claim 7, wherein said conductive plug further comprises at least one outer surface, and said layer of dielectric material is further disposed on at least a portion of said at least one outer surface.

11. An integrated circuit as recited in claim 7, wherein said conductive plug further comprises at least one outer surface, and said layer of dielectric material is further disposed on at least a portion of said at least one outer surface.

12. An integrated circuit as recited in claim 7, wherein said plug is tungsten.

13. An integrated circuit, comprising:
    a conductive plug having a top surface and a cavity, said cavity having side surfaces and at least one outer surface;
    a layer of dielectric material is disposed on said side surfaces of said cavity, and at least a portion of said top surface and at least a portion of said at least one outer surface of said plug; and
    a conductive layer disposed on said layer of dielectric material;

wherein said conductive layer is selected from the group consisting of titanium nitride, tantalum nitride, tungsten nitride.

14. An integrated circuit as recited in claim 13, wherein said cavity has a lower surface and said layer of dielectric material and said conductive layer are further disposed on said lower surface.

15. An integrated circuit as recited in claim 13, wherein said layer of dielectric material is selected from the group consisting of tantalum oxide, silicon oxide, titanium oxide, and barium strontium titinate.

16. An integrated circuit as recited in claim 13, wherein said plug is tungsten.

17. An integrated circuit comprising:

a conductive plug having a top surface and a cavity, said cavity having side surfaces and at least one outer surface;

a layer of dielectric material is disposed on said side surfaces of said cavity, and at least a portion of said top surface and at least a portion of said at least one outer surface of said plug; and a conductive layer disposed on said layer of dielectric material;

wherein said plug is disposed in a dielectric layer having an upper surface and said top surface of said plug is substantially coplanar with said upper surface of said dielectric layer.

18. An integrated circuit as recited in claim 17, wherein said cavity has a lower surface and said layer of dielectric material and said conductive layer are further disposed on said lower surface.

19. An integrated circuit as recited in claim 17, wherein said layer of dielectric material is selected from the group consisting of tantalum oxide, silicon oxide, titanium oxide, and barium strontium titanate.

20. An integrated circuit as recited in claim 17, wherein said plug is tungsten.

* * * * *